(12) United States Patent
Kubiak et al.

(10) Patent No.: US 6,563,907 B1
(45) Date of Patent: May 13, 2003

(54) RADIATION SOURCE WITH SHAPED EMISSION

(75) Inventors: Glenn D. Kubiak, Livermore, CA (US); William C. Sweatt, Albuquerque, NM (US)

(73) Assignee: EUV LLC, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/005,600

(22) Filed: Dec. 7, 2001

(51) Int. Cl.[7] .................................................. G21G 4/00
(52) U.S. Cl. .................... 378/119; 250/504; 315/111.31
(58) Field of Search ........................... 378/119, 85, 34; 250/504 R; 313/634, 573, 607, 609; 315/111.31

(56) References Cited

U.S. PATENT DOCUMENTS

| | | | |
|---|---|---|---|
| 3,609,434 A | 9/1971 | Berry ........................... | 313/93 |
| 5,315,629 A | 5/1994 | Jewell et al. .................. | 378/34 |
| 5,499,282 A | 3/1996 | Silfvast et al. ............... | 378/119 |
| 5,577,092 A | 11/1996 | Kubiak et al. ............... | 378/119 |
| 5,815,310 A | 9/1998 | Williamson .................. | 359/365 |
| 5,963,616 A | 10/1999 | Silfvast et al. ............... | 378/122 |
| 6,031,241 A | 2/2000 | Silfvast et al. .......... | 250/504 R |
| 6,072,852 A | 6/2000 | Hudyma ........................ | 378/34 |
| 6,118,577 A | 9/2000 | Sweatt et al. ................ | 359/351 |
| 6,183,095 B1 | 2/2001 | Hudyma ........................ | 359/857 |
| 6,188,513 B1 | 2/2001 | Hudyma et al. .............. | 359/366 |
| 6,210,865 B1 | 4/2001 | Sweatt et al. ................ | 430/311 |
| 6,225,027 B1 | 5/2001 | Replogle et al. ............. | 430/311 |
| 6,262,836 B1 | 7/2001 | Hudyma et al. .............. | 359/366 |
| 6,285,737 B1 * | 9/2001 | Sweatt et al. .................. | 378/85 |
| 6,307,913 B1 | 10/2001 | Foster et al. .................... | 378/34 |
| 6,414,438 B1 * | 7/2002 | Borisov et al. .......... | 315/111.31 |
| 6,452,194 B2 * | 9/2002 | Bijkerk et al. ............ | 250/492.2 |
| 6,498,832 B2 * | 12/2002 | Spence et al. ............... | 378/119 |

OTHER PUBLICATIONS

Mirkarimi, P.B. et al., "Advances in the reduction and compensation of film stress in high–reflectance multilayer coatings for extreme ultraviolet lithography", SPIE vol. 3331, pp133–148.

Klosner, M.A. et al., "Intense plasma discharge source at 13.5 nm for extreme–ultraviolet lithography", Optic Letters, vol. 22, No. 1, 1997, pp. 34–36.

Kubiak, G.D., et al., "High–power extreme ultraviolet source based on gas jets", SPIE vol. 3331, pp. 81–89.

Klosner, M.A. et al., "Intense xenon capillary discharge extreme–ultraviolet source in the 10–16–nm–wavelength region", Optics Letters, vol. 23, No. 20, 1998, pp. 1609–1611.

(List continued on next page.)

Primary Examiner—Drew A. Dunn
Assistant Examiner—Irakli Kiknadze
(74) Attorney, Agent, or Firm—Fliesler Dubb Meyer & Lovejoy LLP

(57) ABSTRACT

Employing a source of radiation, such as an electric discharge source, that is equipped with a capillary region configured into some predetermined shape, such as an arc or slit, can significantly improve the amount of flux delivered to the lithographic wafers while maintaining high efficiency. The source is particularly suited for photolithography systems that employs a ringfield camera. The invention permits the condenser which delivers critical illumination to the reticle to be simplified from five or more reflective elements to a total of three or four reflective elements thereby increasing condenser efficiency. It maximizes the flux delivered and maintains a high coupling efficiency. This architecture couples EUV radiation from the discharge source into a ring field lithography camera.

34 Claims, 4 Drawing Sheets

OTHER PUBLICATIONS

Silfvast, W.T., et al., "High–power plasma discharge source at 13.5 nm and 11.4 nm for EUV lithography", Proceedings of SPIE, Yuli Vladimirsky, 3676, pp 272–275, 1999.

Dedkov, V.S. et al., "Properties of Rhombohedral Pyrolytic Boron Nitride", Inorganic Materials, vol. 32, No. 6, 1996, pp. 609–614.

Duclaux, L., et al. "Structure and low–temperature thermal conductivity of pyrolytic boron nitride", Physical Review B, vol. 46, No. 6, 1992, pp. 3362–3367.

Moore, A.W., "Compression Annealing of Pyrolytic Boron Nitride" Nature "Letters to the Editor", vol. 221, 1969, pp 1133–1134.

* cited by examiner

RADIATION SOURCE WITH SHAPED EMISSION

This invention was made with Government support under Contract No. DE-AC04-94AL85000 awarded by the U.S. Department of Energy to Sandia Corporation. The Government has certain rights to the invention.

FIELD OF THE INVENTION

This invention relates generally to the production of radiation, particularly extreme ultraviolet and soft x-rays, with a shaped, extended capillary electric discharge source for projection lithography.

BACKGROUND OF THE INVENTION

Projection lithography is a powerful and essential tool for microelectronics processing. As feature sizes are driven smaller and smaller, optical systems are approaching their limits caused by the wavelengths of the optical radiation. "Long" or "soft" x-rays (a.k.a. Extreme UV) (wavelength range of $\lambda=100$ to $200$ Å ("Angstrom")) are now at the forefront of research in efforts to achieve the smaller desired feature sizes. Soft x-ray radiation, however, has its own problems. The complicated and precise optical lens systems used in conventional projection lithography do not work well for a variety of reasons. Chief among them is the fact that there are no transparent, non-absorbing lens materials for soft x-rays and most x-ray reflectors have efficiencies of only about 70%, which in itself dictates very simple beam guiding optics with very few surfaces.

Projection lithography has natural advantages over proximity printing. One advantage is that the likelihood of mask damage is reduced because the mask does not have to be positioned within microns of the wafer as is the case for proximity printing. The cost of mask fabrication is considerably less because the features are larger. Imaging or camera optics in-between the mask and the wafer compensate for edge scattering and, so, permit use of longer wavelength radiation. Use of EUV radiation in bands at which multilayer coatings have been developed (i.e., $\lambda=13.4$ nm, $\lambda=11.4$ nm) allows the use of near-normal reflective optics. This in turn has lead to the development of lithography camera designs that are nearly diffraction limited over useable image fields. The resulting system is known as extreme UV ("EUVL") lithography (a.k.a., soft x-ray projection lithography ("SXPL")).

A favored form of EUVL projection optics is the ringfield camera. All ringfield optical forms are based on radial dependence of aberration and use the technique of balancing low order aberrations, i.e., third order aberrations, with higher order aberrations to create long, narrow arcuate fields of aberration correction located at a fixed radius as measured from the optical axis of the system (regions of constant radius, rotationally symmetric with respect to the axis). Consequently, the shape of the corrected region is an arcuate or curved strip rather than a straight strip. The arcuate strip is a segment of the circular ring with its center of revolution at the optic axis of the camera. See FIG. 4 of Jewell et al., U.S. Pat. No. 5,315,629 for an exemplary schematic representation of an arcuate slit defined by width, W, and length, L, and depicted as a portion of a ringfield defined by radial dimension, R, spanning the distance from an optic axis and the center of the arcuate slit. The strip width defines a region in which features to be printed are sharply imaged. Outside this region, increasing residual astigmatism, distortion, and Petzval curvature at radii greater or smaller than the design radius reduce the image quality to an unacceptable level. Use of such an arcuate field allows minimization of radially-dependent image aberrations in the image and use of object:image size reduction of, for example, 4:1 reduction, results in significant cost reduction of the, now, enlarged-feature mask.

Sweatt al. al. U.S. Pat. No. 6,118,577 discloses a condenser system that couples radiation from a small diameter source to a ringfield camera. The condenser system typically includes six substantially equal radial segments of a parent aspheric mirror, each having one focus at the radiation source and line focus filling the object field of the camera at the radius of the ringfield and each producing a beam of radiation. The condenser system also includes a corresponding number of sets of correcting mirror means which are capable of translation or rotation, or both, such that all of the beams of radiation pass through the real entrance pupil of the camera and form a coincident arc image at the ringfield radius.

The overall layout of an EUV lithography system used with the Sweatt condenser is shown in FIG. 4. The radiation is collected from the source 22 by mirror segments 30 (referred to collectively as the "$C_1$" mirrors) which create arc images that are in turn are rotated by roof mirror pairs illustrated collectively as mirrors 40 and 50 (referred to as the "$C_2$" and "$C_3$" mirrors, respectively). Beams of radiation reflected from mirrors 50 are reflected by a toric mirror 60 (or $C_4$ mirror) to deliver six overlapped ringfield segments onto reflective mask 70. Mirror 31 creates an arc image and roof mirror pair 41 and 51 rotates the arc image to fit the slit image and translate it to the proper position. Similar arc images are created and processed by mirror combinations 32, 42, and 52, and so on. Mirrors 41, 42, and 43 are parts of different and unique channels; and the group of mirrors 44, 45, and 46 is a mirror image of the group of mirrors 41, 42, and 43, respectively. An illustrative arc 71 is shown on mask 70. The EUV lithography system further includes a ringfield camera 77 having a set of mirrors which images the mask using the radiation onto wafer 78.

Despite the advantages of the Sweatt condenser system, the art is still searching for improved efficiency. Achieving sufficient EUV flux at the wafer to support a high wafer throughput commercial EUV lithography "step-and-scan" exposure tool is a significant challenge. Of the many elements that impact tool throughput, EUV source power and condenser efficiency both have tremendous leverage. For example, eliminating a single mirror in a condenser can increase flux at the wafer by a factor of $(R_{mirror})^{-1}$ or approximately 1.5x.

SUMMARY OF THE INVENTION

The present invention is based in part on the recognition that employing a source of radiation, such as an electric discharge source, which is equipped with a capillary region that is configured into some predetermined shape, such as an arc or slit, can significantly improve EUV flux. One reason is that the condenser which delivers critical illumination to the reticle can be simplified from five or more reflective elements to a total of three or four reflective elements thereby increasing condenser efficiency. In this regard, preferably the dimensions of the non-circular shaped capillary bore correspond to that of the desired image that is focused by the camera. In the case where the inventive capillary discharge source is used in an EUV lithography system where the camera focuses arc or slit shaped images, the capillary discharge source has a bore having a length to width ratio that substantially matches that of the arc or slit shaped image that is focused by the camera. This enables the employment of a simpler condenser with fewer mirrors since the magnification parallel and perpendicular to the arc or slit can be approximately equal.

Accordingly, in one embodiment the invention is directed to a capillary discharge source that includes:

a body constructed from a dielectric material that defines a capillary with a bore having a non-circular shaped cross section; and a gaseous species inserted into the capillary, wherein the capillary is used to generate radiation discharges.

In a preferred embodiment, the bore has a proximal end and a distal end and the source further includes:

(i) a source of gas that is in communication with the capillary bore;

(ii) a first electrode positioned at the distal end of the bore;

(iii) a second electrode at a reference potential positioned at the proximal end of the bore; and (iv) a source of electric potential that is selectively connectable to the first electrode.

In another embodiment, the invention is directed to a source of radiation that includes:

means for generating radiation; and a channel having a non-circular cross section that is coupled to the means for generating radiation so that radiation emanating from the source comprises a beam of radiation having a non-circular cross section.

In a further embodiment, the invention is directed to a photolithography system for projecting a mask image onto a wafer that comprises:

a ringfield camera;

a capillary discharge source that includes:

(i) a body constructed from a dielectric material that defines a capillary with a bore having a non-circular shaped cross section; and (ii) a gaseous species inserted into the capillary, wherein the capillary is used to generate radiation discharges;

a condenser for processing the source radiation to produce a ringfield illumination field and for illuminating a mask;

a mask that is positioned at the ringfield camera's object plane and from which the mask image in the form of an intensity profile is reflected into the entrance pupil of the ringfield camera; and a wafer onto which the mask imaged is projected from the ringfield camera.

In yet another embodiment, the invention is directed to a photolithography system for projecting a mask image onto a wafer that includes:

a ringfield camera;

a source of radiation that includes:

(i) means for generating radiation; and (ii) a channel having a non-circular cross section that is coupled to the means for generating radiation so that radiation emanating from the source comprises a beam of radiation having a non-circular cross section;

a condenser for processing the source radiation to produce a ringfield illumination field and for illuminating a mask;

a mask that is positioned at the ringfield camera's object plane and from which the mask image in the form of an intensity profile is reflected into the entrance pupil of the ringfield camera; and a wafer onto which the mask imaged is projected from the ringfield camera.

In an additional embodiment, the invention is directed to a method of producing radiation that includes the steps of:

(a) providing a capillary discharge plasma source that comprises a body that defines a capillary bore having a non-circular shaped cross section;

(b) introducing gaseous species into the capillary bore; and (c) creating a plasma within the capillary bore thereby producing radiation of a selected wavelength that is emitted from the capillary bore whereby the emitted radiation has a non-circular shaped cross section which matches that of the capillary bore.

DETAILED DESCRIPTION OF THE INVENTION

Figure 1A:
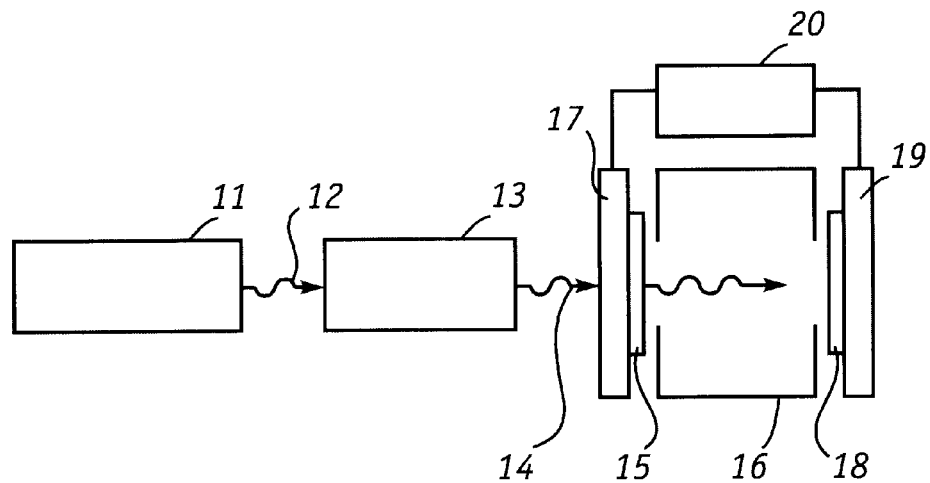
FIG. 1A illustrates an EUV lithography system.

The capillary discharge source of the present invention will be illustrated as an electric discharge source that is particularly suited for generating EUV and soft x-rays for photolithography, however, it is understood that the invention can be employed to generated shaped emissions of radiation at other wavelengths as well. FIG. 1A schematically depicts an apparatus for EUV lithography that comprises a radiation source 11 that has a shaped emission and that emits soft x-rays 12 into condenser 13 which in turn emits beam 14 that illuminates a portion of reflective reticle or mask 15. Suitable condensers are described for example in U.S. Pat. Nos. 6,118,577 and 6,210,865, which are incorporated herein by reference. The emerging patterned beam is introduced into the imaging optics 16 which projects an image of mask 15, shown mounted on mask stage 17, onto wafer 18 which is mounted on stage 19. Element 20, an x-y scanner, scans mask 15 and wafer 18 in such direction and at such relative speed as to accommodate the desired mask-to-image reduction. The imaging optics 16 can comprise a ringfield camera which is described for example in U.S. Pat. Nos. 6,072,852, 6,183,095 and 6,188,513, which are incorporated herein by reference.

One critical feature of the present invention is that the radiation emanating from the radiation source, e.g., the cross section of soft x-rays 12 in FIG. 1A, has a predetermined or desired non-circular shape such as, for example, a cross-section that is shaped as an arc or slit. The preferred embodiment of the invention will be illustrated with an electric discharge source that has a novel capillary design wherein the capillary bore is arc-shaped. As is apparent, it is not necessary for the entire length of the capillary bore to have the non-circular, e.g., arc, shape. Rather, it is only necessary that the bore at the capillary exit exhibit a non-circular configuration sufficient to cause the emitted radiation to have a matching non-circular cross section. Thus, the term "bore" when used in reference to the non-circular cross-section refers to (i) the bore exit or (ii) the bore exit and at least portions of the capillary bore along its length. By "arc" is meant a continuous portion (as of a circle or ellipse) of a curved segment and by "slit" is meant an elongated, usually a long, narrow rectangular opening. The shape of the arc is defined by its width, length, and radius of curvature and the slit is defined by the width and length. As is apparent, a "slit" can be viewed as an arc with an infinite radius of curvature. Preferably when the capillary discharge source is used in an EUV lithography system where the camera images arc or slit shaped images, the capillary discharge source has a bore that has a length to width ratio that substantially matches the length to width ratio of the arc or slit shaped mask area that is imaged by the camera. In this fashion, the condenser can be more readily design with simpler optics, i.e., fewer mirrors, because of the magnification parallel and perpendicular to the arc or slit can be approximately equal. In the case where the bore of the discharge source has a slit configuration, i.e., the bore exit is a narrow elongated aperture, so that the discharge emissions have a matching cross section, a suitably designed condenser can be employed to process or modify the rectangular contour of the discharge emissions to produce an illumination that has a contour that substantially matches the ring-field camera's arcuate slit field. In particular, the condenser can be designed so that as it maps the arc or slit shaped discharges, the ratio of (i) the radius of curvature of the arc or slit to (ii) the arc or slit's length is modified by the condenser optics to match a desired ratio at the camera's slit, that is, to substantially match the same measured ratio of the mask image (or an intensity profile) or area of illumination at the mask plane. For example, when the bore has a slit cross section, the condenser can image the radiation onto the desired arcuate field at the camera's mask plane by an appropriately designed condenser.

Figure 2B:
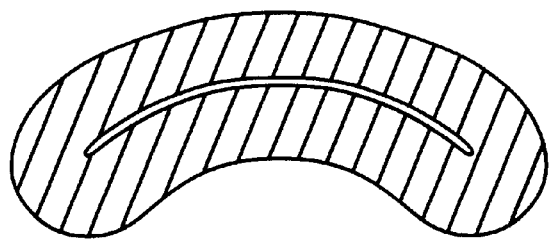
FIG. 2B illustrates the cross-sectional view of a shaped, extended capillary arc-shaped bore in a dielectric medium.
Figure 2A:
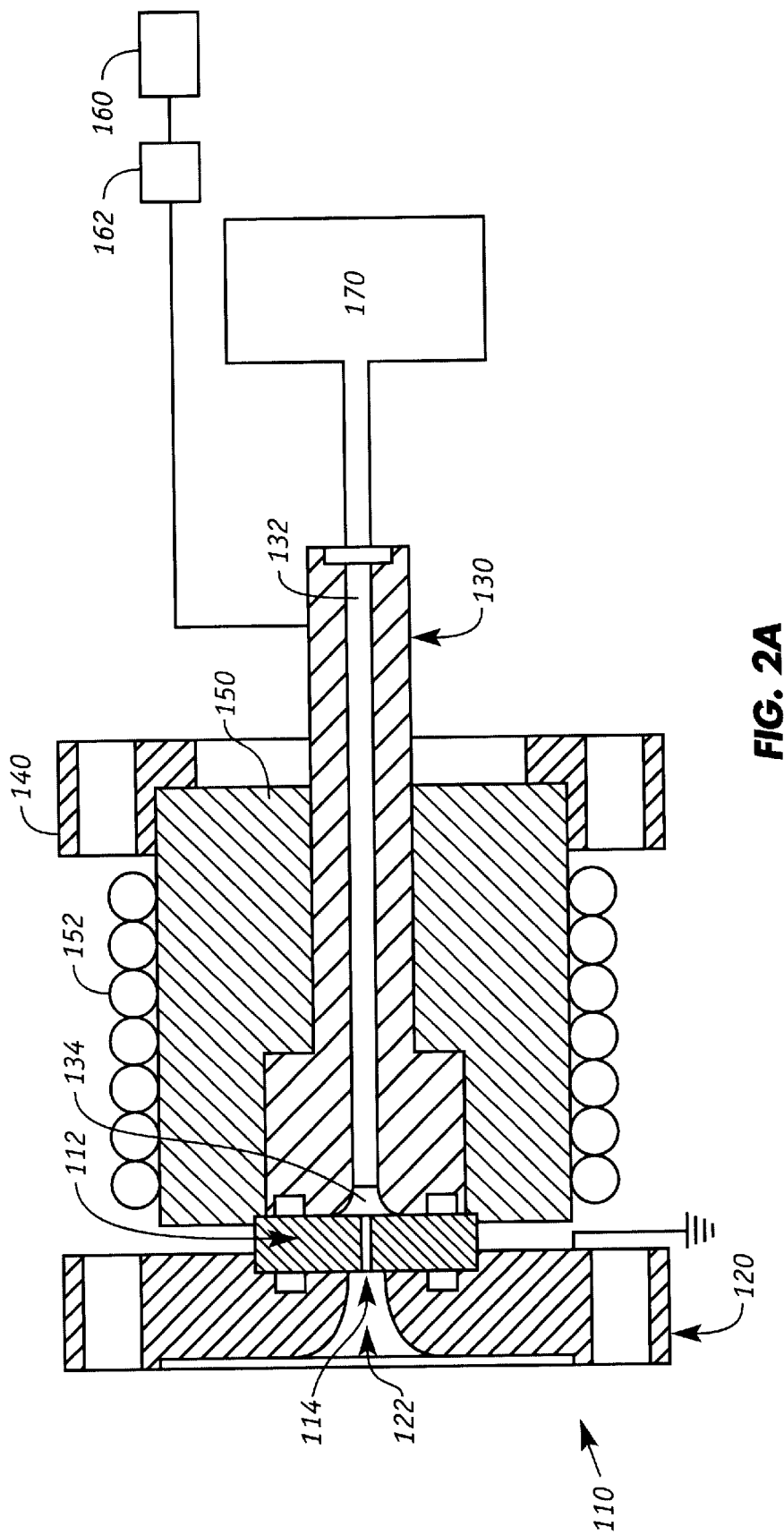
FIG. 2A illustrates an electric discharge source.

The radiation source is preferably an electric discharge source. Conventional electric discharge sources can be modified with the novel capillary design. For example, the axisymmetric capillary of a conventional source, which is typically has a 1–1.5 mm diameter circular bore is replaced with the novel capillary. A preferred embodiment is illustrated in FIG. 2A which shows the cross-section of an electric capillary discharge source 110 which preferably comprises an insulating disk 112 that has a capillary bore 114. The disk 112 is mounted between two electrodes 120 and 130 which are in proximity to the front and back surfaces of the disk, respectively. The disk is made of any suitable ceramic material, such as diamond or boron nitride, and more preferably of pyrolytic boron nitride, compression annealed pyrolytic boron nitride, or cubic boron nitride. FIG. 2B is the cross section of capillary bore 114 showing the arc-shaped opening formed within the dielectric medium.

Front electrode 120 is typically grounded and has an aperture 122 having a center that is aligned with the center of the capillary bore 114. Rear electrode 130 has a channel 132 with an inlet and an outlet 134. The outlet 134 is connected to the capillary bore at the back end of disk 112 while the inlet is connected to a gas source 170. Rear electrode 130 is also connected to a source of electric potential 160 which includes a switch mechanism 162 to generate electric pulses. To facilitate the removal of heat, front and rear electrodes and capillaries are preferably encased in a thermally conductive housing 150 which in turn can be surrounded by coils 152 through which a coolant, e.g., water, is circulated. Flange 140 is secured to an outer edge of the conductive housing 150. Front and rear electrodes are made of any suitable electrically conductive and erosion resistant material such as refractory metals, e.g., tantalum or tungsten.

The electric capillary discharge source 110 can employ a pulsed electric discharge in a low-pressure gas to excite a plasma confined within a capillary bore region. A high-voltage, high-current pulse is employed to initiate the discharge thereby creating a plasma, e.g., 2–60 eV, that radiates radiation in the EUV region. The source of gas 170 contains any suitable gas that can be ionized to generate a plasma from which radiation of the desired wavelength occurs. For generating extreme ultraviolet radiation and soft x-rays, xenon is preferred.

The capillary discharge source is typically employed so that at least the front electrode is positioned within a housing that is maintained at a sub-atmospheric pressure, typically, at a pressure of approximately $1 \times 10^{-3}$ Torr or less. The rear electrode can be coupled to a high-voltage source such as a pulser capable of producing sufficient discharge current for a duration that ranges, for example, from about 0.5 to 4 $\mu$sec.

Figure 1B:
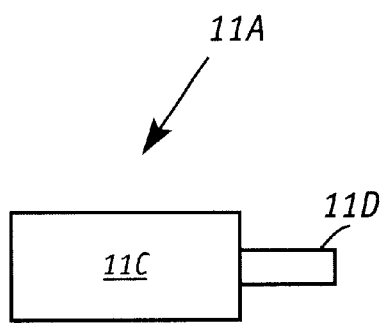
FIG. 1B illustrates a radiation source.

Because of the arc-shaped cross-section of the capillary bore in electric discharge source, the radiation beam emanating from the electric capillary discharge source will have a cross-section matching that of the arc-shaped cross-section of the capillary bore. As a result, condenser 13 as depicted in FIG. 1 can be modified to require fewer reflective surfaces to focus an arc image to the reflective reticle or mask. It is expected that the number of reflective elements in the condenser can be as few as two although three or four mirrors may be more practical when the inventive radiation source is employed.

Figure 3A:
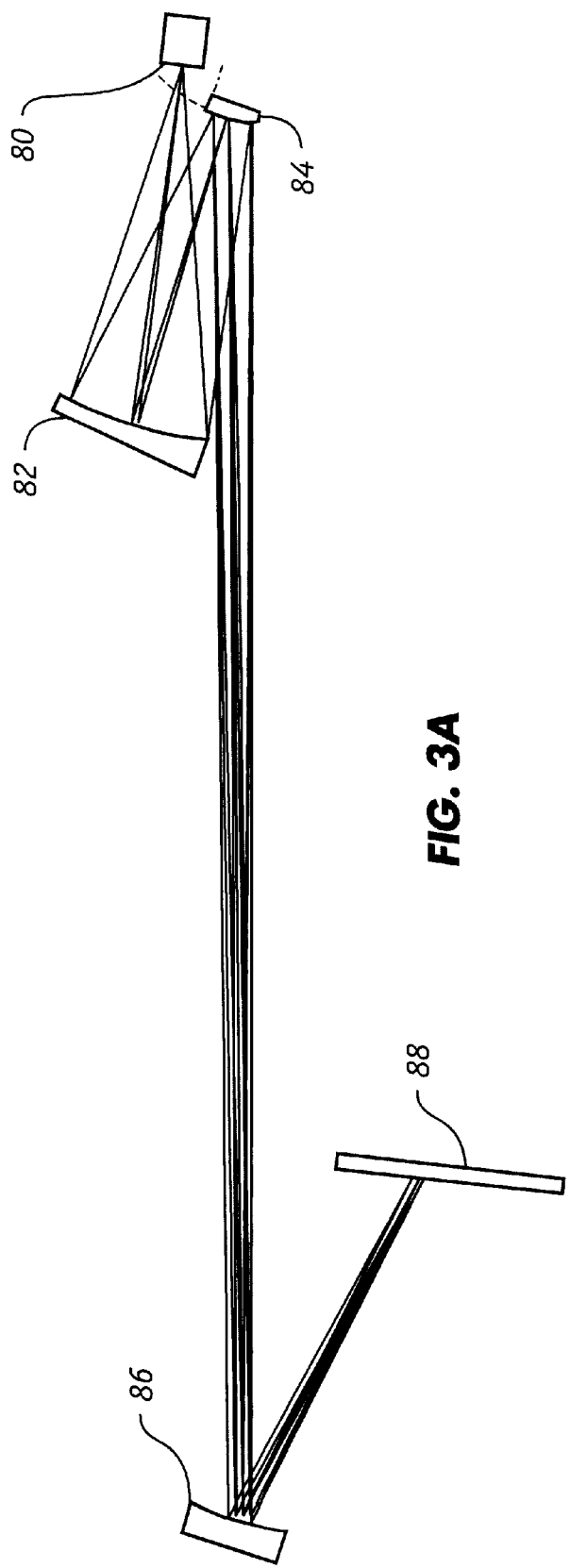
FIG. 3A illustrates a three mirror condenser system.
Figure 3B:
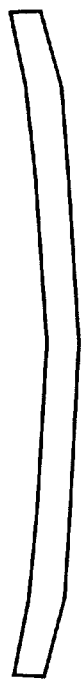
FIG. 3B illustrates the shape of an illumination pattern on the mask plane.
Figure 4:
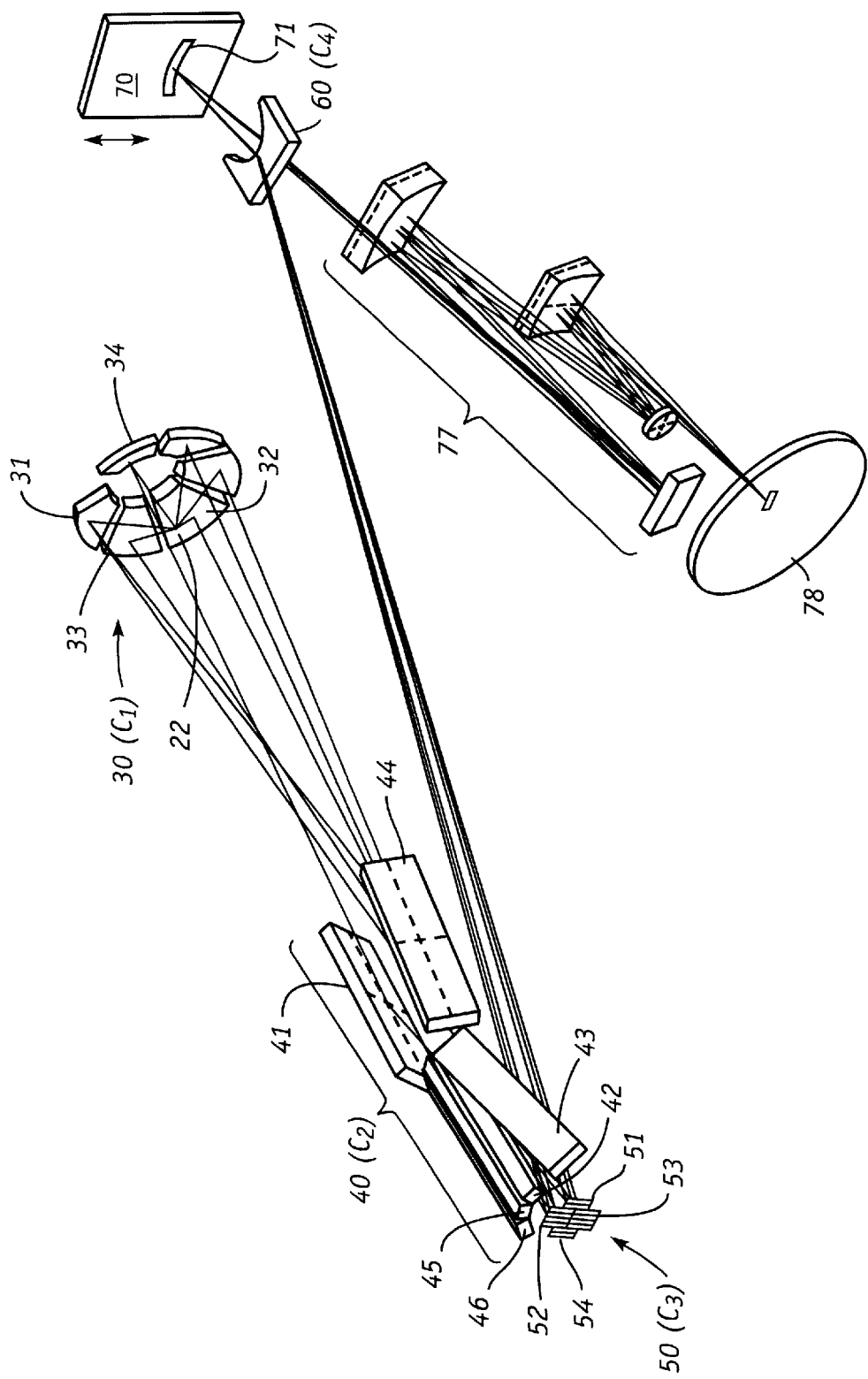
FIG. 4 illustrates a prior art lithography system.

A modified condenser using only 3 mirrors (or 3 sets of mirrors) suitable for use with the radiation source of FIG. 2A that has an arc-shaped bore shown in FIG. 2B is illustrated in FIG. 3A. The radiation is collected from the source 80 by a mirror 82 which reflects the arc-shaped image from the radiation source to mirrors 84 and 86 and onto mask 88. Mirrors 82 and 84 are illustrated as off-axis conic sections. Mirror 88 is preferably a toroidal mirror. FIG. 3B shows the shape of the imaged area on the surface of mask 88 (FIG. 3A).

The use of critical illumination places tight tolerances on the intensity uniformity of the shaped capillary source emission since an image of the source intensity distribution is projected directly on the reticle. It may be possible to make the effective scan-averaged intensity distribution more uniform by modulating the capillary arc width along its length, for example, by adding serifs near the ends of the arc. Another possibility for improving source uniformity is to use guiding magnetic fields to tailor the plasma current density along the capillary arc.

A scheme that would smooth out small bright or dark spots in the radiation source is to defocus the source image at the mask. This would require that the source be somewhat oversized, so it would waste some power. The defocus could be introduced in one direction (astigmatism) or in both directions.

There are a number of other possible advantages of the inventive shaped, extended capillary source. First, it is likely that its EUV emission pulse energy can be made larger than that from the conventional axisymmetric capillary due to the significant increase in its source emission area. To achieve increased EUV pulse energy and to approximately maintain the present axisymmetric capillary source brightness, it is very likely that the peak current necessary to drive the discharge would have to be increased to conserve peak current density within the extended capillary region. This will place additional demands on the high-voltage pulsed power supply and also on capillary cooling requirements (if the pulse duration is not shortened). Alternatively, it may be better to keep the peak current at its present level and take advantage of the increased area of the extended capillary to reduce the incident power density on the inner wall surface of the capillary. This will reduce the transient temperature rise at the plasma/capillary interface and will also result in more efficient heat extraction from the capillary body, allowing the repetition rate to be increased.

It is understood that the inventive radiation source can comprise any suitable device that generates radiation, e.g., x-rays or EUV; the only requirement is that it includes means for shaping the light beam that enters the condenser. Any conventional capillary discharge source can be modified by employing the novel capillary design described above. Conventional radiation sources that can be employed with the appropriate novel channel or modified with the novel capillary include, for example, a synchrotron and laser-generated plasma sources. Suitable radiation sources are further described, for example., in Kubiak et al "High-power extreme ultraviolet source based on gas jet," Proceedings of SPIE 3331, 81–89 (1998), Klosner and Silfvast "Intense xenon capillary discharge extreme-ultraviolet source in the 10–16-nm-wavelength region." Optical Letters 23, 20 1609–1611 (1998), Kubiak et al U.S. Pat. No. 5,577,092 "Cluster Beam Targets for Laser Plasma Extreme ultraviolet and Soft X-Ray Source", Silfvast U.S. Pat. No. 5,499,282 "Efficient Narrow Spectral Width Soft-X-Ray Discharge Sources, and Silfvast et al. U.S. Pat. No. 5,963,616 "Configuration, Materials, and Wavelengths for EUV Lithium Plasma Discharge Lamps", and Silfvast et al. U.S. Pat. No. 6,031,241 "Capillary Discharge Extreme Ultraviolet Lamp Source for EUV Microlithography and Other Related Applications," which are all incorporated herein by reference.

Although only preferred embodiments of the invention are specifically disclosed and described above, it will be appreciated that many modifications and variations of the present invention are possible in light of the above teachings and within the purview of the appended claims without departing from the spirit and intended scope of the invention.

What is claimed is:

1. A capillary discharge source comprising:
    a body constructed from a dielectric material that defines a capillary with a bore having a non-circular shaped cross section; and
    a gaseous species inserted into the capillary, wherein the capillary is used to generate radiation discharges.

2. The capillary discharge source of claim 1 wherein the shaped cross section defines an arc or slit.

3. The capillary discharge source of claim 1 wherein the capillary generates extreme ultraviolet radiation.

4. The capillary discharge source of claim 1 wherein the bore has a proximal end and a distal end and the source further comprises:
    (i) a source of gas that is in communication with the capillary bore;
    (ii) a first electrode positioned at the distal end of the bore;
    (iii) a second electrode at a reference potential positioned at the proximal end of the bore; and
    (iv) a source of electric potential that is selectively connectable to the first electrode.

5. The capillary discharge source of claim 4 wherein the capillary generates extreme ultraviolet radiation.

6. The capillary discharge source of claim 4 wherein the second electrode is positioned to receive radiation emitted from the proximal end of the capillary bore and having a non-circular shaped opening, which matches that of the capillary bore, through which radiation is emitted.

7. The capillary discharge source of claim 6 wherein the shaped cross section defines an arc or slit.

8. A source of radiation comprising:
    means for generating radiation; and
    a channel having a non-circular cross section that is coupled to the means for generating radiation so that radiation emanating from the source comprises a beam of radiation having a non-circular cross section.

9. The source of claim 8 wherein the cross section defines an arc or slit.

10. The source of claim 8 wherein the source generates a beam of extreme ultraviolet radiation.

11. A photolithography system for projecting a mask image onto a wafer that comprises:
    a ringfield camera;
    a capillary discharge source that comprises:
        (i) a body constructed from a dielectric material that defines a capillary with a bore having a non-circular shaped cross section; and
        (ii) a gaseous species inserted into the capillary, wherein the capillary is used to generate radiation discharges;
    a condenser for processing the source radiation to produce a ringfield illumination field and for illuminating a mask;
    a mask that is positioned at the ringfield camera's object plane and from which the mask image in the form of an intensity profile is reflected into the entrance pupil of the ringfield camera; and
    a wafer onto which the mask imaged is projected from the ringfield camera.

12. The system of claim 11 wherein the condenser employs 4 or fewer reflective surfaces to produce the ringfield illumination field.

13. The system of claim 11 wherein the capillary generates extreme ultraviolet radiation.

14. The system of claim 13 wherein the extreme ultraviolet radiation discharges from the capillary discharge source have an arc or slit shaped cross section and wherein the condenser maps the arc or slit shaped discharges into the ringfield camera, and characterized in that the length to width ratio of the arc or slit shaped extreme ultraviolet discharges is substantially the same as the length to width ratio of the ringfield camera's arcuate slit.

15. The system of claim 14 wherein the shaped cross section defines a slit and the condenser images the radiation onto a desired arcuate field.

16. The system of claim 11 wherein the shaped cross section defines an arc or slit.

17. The system of claim 16 wherein the capillary generates extreme ultraviolet radiation.

18. The system of claim 17 wherein the arc or slit has a length to width ratio that substantially matches the length to width ratio of the intensity profile.

19. The system of claim 11 wherein the bore has a proximal end and a distal end and the source further comprises:
    (i) a source of gas that is in communication with the capillary bore;

(ii) a first electrode at a reference potential positioned at the distal end of the bore;

(iii) a second electrode positioned at the proximal end of the bore;

(iv) a source of electric potential that is selectively connectable to the first electrode.

20. The system of claim 19 wherein the capillary generates extreme ultraviolet radiation.

21. The system of claim 19 wherein the second electrode is positioned to receive radiation emitted from the proximal end of the capillary bore and having a non-circular shaped opening, which matches that of the capillary bore, through which radiation is emitted.

22. The system of claim 21 wherein the shaped cross section defines an arc or slit.

23. The system of claim 22 where the arc or slit has a length to width ratio that substantially matches the length to width ratio of the intensity profile.

24. A photolithography system for projecting a mask image onto a wafer that comprises:

a ringfield camera;

a source radiation that comprises:

(i) means for generating radiation; and (ii) a channel having a non-circular cross section that is coupled to the means for generating radiation so that radiation emanating from the source comprises a beam of radiation having a non-circular cross section;

a condenser for processing the source radiation to produce a ringfield illumination field and for illuminating a mask;

a mask that is positioned at the ringfield camera's object plane and from which the mask image in the form of an intensity profile is reflected into the entrance pupil of the ringfield camera; and a wafer onto which the mask imaged is projected from the ringfield camera.

25. The system of claim 24 wherein the cross section defines an arc or slit.

26. The system of claim 25 where the arc or slit has a length to width ratio that substantially matches the length to width ratio of the intensity profile.

27. The system of claim 24 wherein the capillary generates extreme ultraviolet radiation.

28. A method of producing radiation that comprises the steps of:

(a) providing a capillary discharge plasma source that comprises a body that defines a capillary bore having a non-circular shaped cross section;

(b) introducing gaseous species into the capillary bore; and (c) creating a plasma within the capillary bore thereby producing radiation of a selected wavelength that is emitted from the capillary bore whereby the emitted radiation has a non-circular shaped cross section which matches that of the capillary bore.

29. The method of claim 28 wherein the capillary bore has a cross section defining an arc or slit.

30. The method of claim 28 wherein the capillary bore has a proximal end and a distal end and the capillary discharge source further comprises:

(i) a source of gas that is in communication with the capillary bore;

(ii) a first electrode positioned at the distal end of the bore;

(iii) a second electrode at a reference potential positioned at the proximal end of the bore; and (iv) a source of electric potential that is selectively connectable to the first electrode.

31. The method of claim 30 wherein the shaped cross section defines an arc or slit.

32. The method of claim 30 wherein step (c) comprises the steps of (i) introducing gas from the source of gas into the channel of the first electrode and into the capillary bore; and (ii) causing an electric discharge in the capillary bore sufficient to create a plasma within the capillary bore thereby producing radiation of a selected wavelength.

33. The method of claim 30 wherein the emitted radiation is extreme ultra-violet radiation and the gaseous species is xenon.

34. The method of claim 28 wherein the emitted radiation is extreme ultra-violet radiation.

* * * * *